(12) United States Patent
Fernandez

(10) Patent No.: US 6,517,641 B2
(45) Date of Patent: Feb. 11, 2003

(54) APPARATUS AND PROCESS FOR COLLECTING TRACE METALS FROM WAFERS

(75) Inventor: Douglas Fernandez, Richmond, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 32 days.

(21) Appl. No.: 09/855,561

(22) Filed: May 16, 2001

(65) Prior Publication Data
US 2002/0170578 A1 Nov. 21, 2002

(51) Int. Cl.7 .............................. B08B 3/04; B08B 5/04
(52) U.S. Cl. ..................... 134/33; 134/21; 134/144; 134/157; 134/902
(58) Field of Search .................... 134/33, 21, 144, 134/157, 902

(56) References Cited

U.S. PATENT DOCUMENTS

| 4,231,809 | A |   | 11/1980 | Schmidt ............... 148/1.5 |
| 4,564,280 | A | * | 1/1986  | Fukuda ............... 118/321 |
| 5,001,084 | A | * | 3/1991  | Kawai et al. ............ 134/33 |
| 5,217,925 | A |   | 6/1993  | Ogawa et al. ........... 437/225 |
| 5,350,428 | A |   | 9/1994  | Leroux et al. .......... 29/25.01 |
| 5,418,172 | A |   | 5/1995  | Falster et al. ............ 437/8 |
| 5,997,653 | A | * | 12/1999 | Yamasaka ............ 134/102.1 |
| 6,092,542 | A | * | 7/2000  | Matsuda et al. ......... 118/321 |
| 6,100,167 | A |   | 8/2000  | Falster et al. ............ 438/502 |
| 6,106,635 | A | * | 8/2000  | Hamada et al. .......... 134/144 |
| 6,431,184 | B1 | * | 8/2002 | Taniyama .............. 134/1 |

* cited by examiner

Primary Examiner—Randy Gulakowski
Assistant Examiner—Saeed Chaudhry
(74) Attorney, Agent, or Firm—Jerome J. Norris

(57) ABSTRACT

An improved process for cleaning a semiconductor wafer surface during manufacture to remove metallic contaminants without the use of robotics and without risk of scanning droplets falling from the wafer, in a faster time than with a manual process using a vacuum wand, comprising:

a) positioning a wafer on a rotating plate pivotably mounted above a platform;

b) contacting the wafer with a metals scanning solution droplet from the tip of a drop probe, the solution being adhered in a bottom portion of the drop probe above the wafer in a material of a surface tension sufficiently higher than the surface tension on the wafer, the drop probe being pivotably connected to a pivot arm which upon pivoting or turning one notch enables droplet sweeping of metal contaminants on a concentric circle on the wafer on the rotating plate;

c) successively turning the pivot arm a sufficient number of notches to enable completion of wafer droplet sweepings through concentric circles to reach the edge of the wafer until all of the surface of the wafer is swept; and d) pipetting the solution droplet containing metal contaminants out of the probe for analysis.

14 Claims, 2 Drawing Sheets

APPARATUS AND PROCESS FOR COLLECTING TRACE METALS FROM WAFERS

BACKGROUND OF THE INVENTION

1. Field of the Invention

The present invention relates to apparatus for and a method of cleaning the surface of semiconductor wafers to remove and measure levels of metallic contamination. More particularly, the apparatus uses a rotating plate with wafer stand-offs and a motor controller to control the speed of the rotation while a solution droplet is administered through a probe onto the wafer by an operator, who moves a pivot arm attached to the probe about 1.5 degrees until all of the wafer is touched by the droplet in a spinoff-like process. The surface tension of the liquid trapped in the bottom of the probe is higher than the surface tension of the etched silicon wafer, and the VPD (vapor phase decomposition) metals collecting solution drop adheres to the bottom of the probe and slides over the bare silicon surface, provided a sufficient gap separates the tip of the probe and the wafer. The solution drop may later be analyzed by mass spectrometry.

2. Description of Prior Art

The advances in semiconductor technology has led to a continual decrease in the size of these electrical devices along with a concomitant need to impose stricter limits on the tendency for increases in electrical current leakage with corresponding decreases in size.

It has been found that the leakage paths are essentially through minority carrier recombination at metallically contaminated sites in the vicinity of the electrical junctions within the device or sub-device cell structure. These paths are detrimentally increased in size when the wafer is contaminated with metals.

Nevertheless, improvements in the manufacture of reduced sized silicon wafers and electrical devices includes a large number of individual processing steps which unfortunately contribute to metal contamination.

An apparatus for and method of cleaning semiconductor wafers is disclosed in U.S. Pat. No. 5,217,925. The apparatus comprises:

an ice maker to provide frozen micro-particles;

a cleaning chamber having a bottom portion including a main outlet;

a holding means for holding a semiconductor wafer in the cleaning chamber;

an injection nozzle for injecting the frozen microparticles into the cleaning chamber towards a semiconductor wafer;

an exhaust duct having a sub-outlet and connected to the main outlet of the cleaning chamber; and an exhaust blower connected to both the main outlet and the sub-outlet.

An electrostatic apparatus for removing particles from semiconductor wafers is disclosed in U.S. Pat. No. 5,350,428. The apparatus comprises a particle removing means contactable with the edge of at least one semiconductor wafer which removes particles from the wafers and which inhibits the return of the particles to the wafers, wherein the particle removing means comprises a non-metallic electrostatically charged material.

U.S. Pat. 4,231,809 disclose a method of removing impurity metals from semiconductor devices. The process comprises:

a process for gettering transition metal impurities from a body of silicon semiconductor material by heating the body in an ambient which includes hydrogen chloride and oxygen the improvement comprising the ambient contains oxygen in a percentage by volume of from about 0.5 and 1.0 to grow a silicon oxide film on the surface of the body to a thickness of not more than about 150 Angstroms.

A method for detecting sources of contamination in silicon using a contamination monitor is disclosed in U.S. Pat. No. 5,418,172. The method comprises:

(a) exposing a contamination monitor wafer having an average minority carrier lifetime greater than about 250 microseconds to the apparatus, fluid or process step, (b) heating the contamination monitor wafer to a temperature of a least 600° C. simultaneous with or subsequent to exposing the wafer to the apparatus, fluid or process step, and (c) determining the minority carrier lifetime or minority carrier diffusion length of the contamination monitor wafer after the wafer has been heated as set forth in step (b) to detect the metal contamination, the contamination monitor wafer having an oxygen precipitate density of less than $10^8$ oxygen precipitates per cubic centimeter after being heated as set forth in step (b).

U.S. Pat. No. 6,100,167 disclose a process for removal of copper from boron doped silicon wafers. The process comprises:

polishing a surface of a boron doped wafer, the polishing process contributing copper to the surface and interior of the wafer, annealing the polished wafer at a temperature of at least about 75° C., for at least about 30 seconds to increase the concentration of copper on the polished surface of the wafer and decrease the concentration of copper in the interior of the wafer, and cleaning the polished surface of the annealed wafer to reduce the concentration of copper thereon, the concentration of copper in the interior of the annealed and cleaned wafer being reduced during the annealing step such that the concentration of copper on the polished and cleaned surface of the wafer will not increase by a factor of more than two upon storage of the wafer at room temperature for a period of 5 months.

There is a need in the art of removing metal contamination from the surface of semiconductor wafers of increasingly smaller sizes to simplify the process of collecting and quantifying metallic contamination.

There is a further need when collecting metallic contamination to eliminate the problem of drops falling off of the wafer during manual scanning with a vacuum wand.

When collecting metallic contamination from the surface of semiconductor wafers, additional needs are:

to accelerate the scanning process from about 5 minutes to about 1.5 minutes;

standardize the scanning process and drop path on the wafer; increase the percentage of area scanned on the wafer to 100%;

eliminate the introduction of errors and contamination by poor operator technique during manual hand-held scanning;

to be able to consistently collect metallic impurities on wafers repeatedly by different operators; and to alleviate operator fatigue during long VPD sessions.

SUMMARY OF THE INVENTION

One object of the present invention is to provide apparatus for and a method of collecting and later quantifying metallic contamination on semiconductor wafers by using a rotating plate with wafer stand-offs and a motor controller to control the speed of rotation, while a solution droplet is administered through a probe onto the wafer by an operator, who moves a pivot arm attached to the probe about 1.5 degrees until all or 100% of the wafer is touched by the droplet in a spin off-like process.

Another object of the present invention is to provide a solution of the metallic contaminants from the wafer using the probe in which the surface tension of the liquid trapped in the bottom of the probe is higher than the surface tension of the etched silicon wafer, thereby allowing the VPD metals collecting solution drop to adhere to the bottom of the probe and slide completely over the silicon surface prior to pipetting and analyzing the droplets.

A further object of the present invention is to provide an apparatus for collection and quantification of metallic contamination on a wafer that consists of:

a motor controller with an adjustable speed knob;

a platform mounted above the motor controller;

a rotateable plate with a wafer stand-off pivotably mounted above the platform;

a shaft mounted on said platform attached to a drop probe by a pivot arm, said drop probe extending downward and over said rotateable plate with wafer stand-offs at a sufficient distance above the wafer so that, when a solution droplet suspended from the probe inscribes a concentric circle on said wafer, due to the higher surface tension of the material holding the solution droplet at the bottom of the probe over that of the wafer, the VPD metals collecting solution drop will adhere to the bottom of the probe and slide over the silicon surface without risk of dropping off and clean off trace metals.

The improved process of the invention for treating a wafer surface during manufacture to remove metallic contaminants without the use of robotics and without risk of scanning droplets falling from the wafer in a faster time than with a manual process using a vacuum wand, is accomplished by:

a) positioning a wafer on a rotating plate pivotably mounted above a platform;

b) contacting the wafer with a metals scanning solution droplet from the tip of a hollow drop probe, the solution being adhered in a bottom portion of the drop probe above the wafer in a material of a surface tension sufficiently higher than the surface tension on said wafer, the drop probe being pivotably connected to a pivot arm which upon pivoting or turning one notch enables droplet sweeping of metal contaminants on a concentric circle on the wafer on the rotating plate;

c) successively turning the pivot arm a sufficient number of notches to enable completion of wafer droplet sweepings through concentric circles to reach the edge of the wafer until all of the surface of the wafer is swept; and d) pipetting the solution droplet containing metal contaminants out of the probe for analysis.

a platform mounted above the motor controller;

a rotateable plate with a wafer stand-off pivotably mounted above the platform;

a shaft disposed on the platform and connected by a pivot arm to a drop probe, said drop probe extending downward and over said rotateable plate with wafer stand-offs at a sufficient distance above the wafer so that, when a solution droplet falling through the probe is rotated by an arm connected to the probe, due to the higher surface tension of the solution droplet trapped at the bottom of the probe, the VPD metals collecting solution drop will adhere to the bottom of the probe and slide completely over the silicon surface to clean off trace metals.

DETAILED DESCRIPTION OF PREFERRED EMBODIMENT OF THE INVENTION

Figure 1:
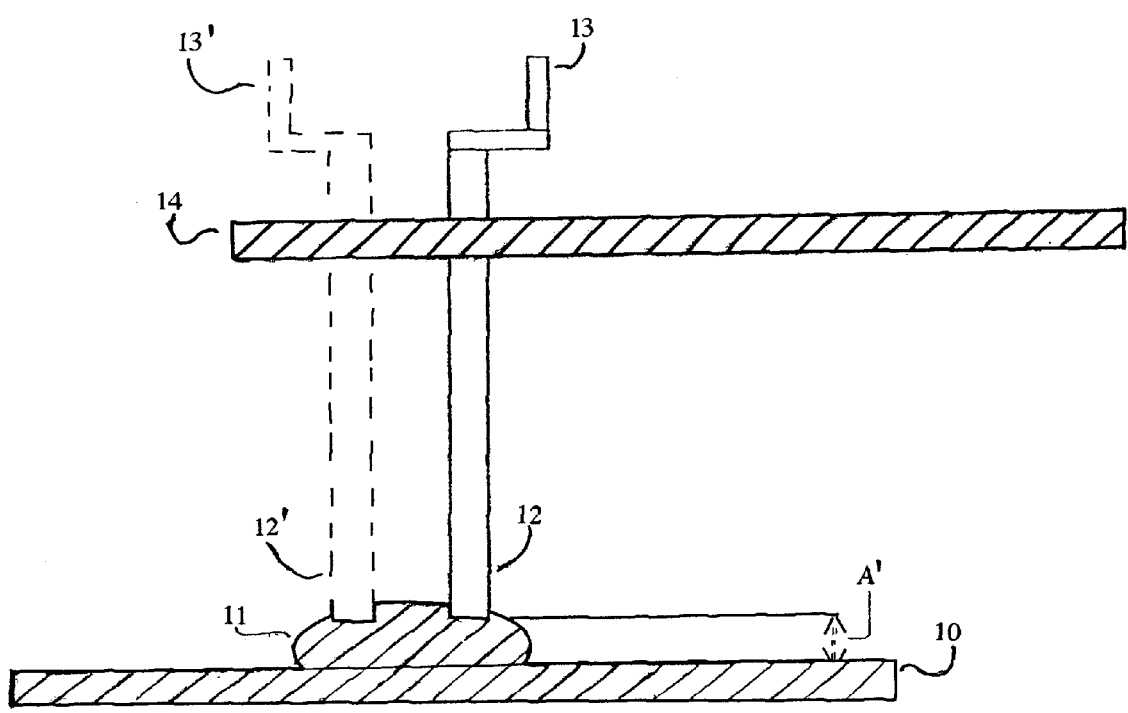
FIG. 1 is a perspective view of an operative part of the invention apparatus showing a wafer on which there is a solution droplet suspended from a probe connected to a rotateable pivot arm.

The manner in which the invention process for collecting and quantifying metallic contamination on wafers is accomplished can be understood by reference to FIG. 1 which is a perspective view of an operative part of the invention apparatus showing a wafer 10 on which a solution droplet 11 touches while the solution is suspended from a drop probe 12 connected to a pivot arm 14. By manually rotating the drop probe 12 through handle 13 so that for one revolution of a rotating plate, with pivot arm 14 steady, a one notch pivot (approximately 1.5 degrees) completes an additional concentric circle on the wafer (as the rotating plate completes one revolution). As may be seen from 12' and 13', pivoting probe 12 through arm 13 results in a change of position of the probe and handle.

The distance of the bottom of the probe to the top of the wafer is not critical as long as it is such that the surface tension of the liquid trapped at the bottom of the probe is higher than the surface tension of the etched silicon wafer, so as to enable the whole VPD metal collecting solution drop to adhere to the bottom of the probe and slide completely over the bare silicon surface.

In the context of the invention, the preferable distance between the bottom of the probe and the top of the wafer surface is between about a 3 to about a 4 mm gap, as designated by A'.

Figure 2:
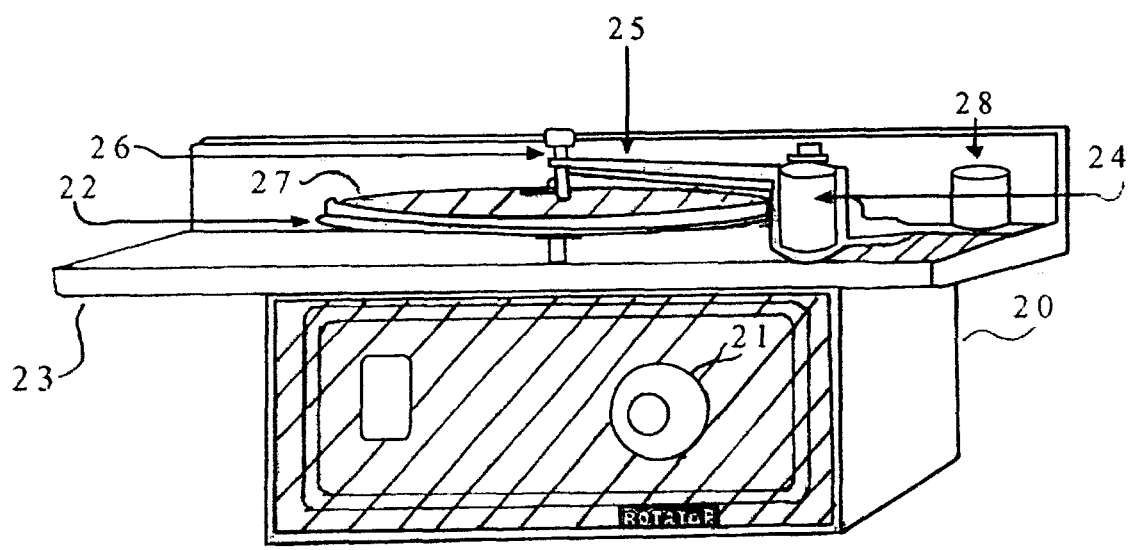
FIG. 2 is a perspective view of the invention apparatus showing the motor controller with adjustable speed knob.

As may be seen from FIG. 2, the invention apparatus for collecting metallic contamination on the wafer utilizes a motor controller 20 comprising an adjustable speed knob 21 to control a rotating plate with wafer standoffs 22. Preferably, the rotating plate is made of polytetrafluoroethylene (PTFE) . A platform 23 (preferably made of polypropylene) is mounted above the motor controller and contains thereon a shaft 24 connected by pivot arm 25, that is connected to a drop probe 26, suspended above wafer 27. Preferably, pivot arm 25 is made of polycarbonate and contains graduated markings thereon to enable an operator to pivot the arm 1 notch (approximately 1.5 degrees) after the rotating plate with wafer standoffs has completed one revolution to sweep out a concentric circle so that a solution droplet as shown in FIG. 1 has completely collected metallic contamination in a given radius at which the arm has been set. This process is continued until the droplet contacts the whole perimeter of the wafer. When the operation is completed and the arm reaches the edge of the wafer so that the drop will have contacted 100% of the wafer's area, the drop may be pipetted out of the probe and into a microvial for analysis with a mass spectrometer. Optionally, a rinse cup 28 may be disposed on top of platform 23 for purposes of rinsing the drop probe prior to utilizing a solution to form a droplet to continue collection of metallic contamination on the wafers.

In the context of the invention, a 200 μl metals scanning solution droplet is pipetted through the trace metal cleaned PTFE hollow drop probe. As the rotating plate is turned at a speed of between about 8 rpm and 12 rpm, the droplet contacts the whole perimeter of the wafer for the given radius at which the arm is set. After the plate completes on revolution as indicated by a timing mark on its edge, the operator pivots the arm approximately one notch (approximately 1.5 degrees) to complete another concentric circle. The operation is completed until the arm reaches the edge of the wafer so as to enable the drop to have contacted 100% of the wafer's area. At the speed of about 8 rpm, the process takes about 90 seconds or 1.5 minutes, and this is an acceleration of the scanning process from the 5 minutes now utilized during the manual scanning with a vacuum wand.

The apparatus and process therefrom of the invention enables avoidance of the expensive robotics process of cleaning wafers, by use of a manual process that is more than 3 times (3.3) faster than the manual process of using a vacuum wand to remove metallic contaminants.

While various changes may be made in the invention method without departing from the scope of the invention, which has been set forth by illustration rather than limitation.

I claim:

1. An improved process for cleaning a semiconductor wafer surface during manufacture to remove metallic contaminants without the use of robotics and without risk of scanning droplets falling from the wafer, in a faster time than with a manual process using a vacuum wand, comprising:
   a) positioning a wafer on a rotating plate pivotably mounted above a platform;
   b) contacting said wafer with a metals scanning solution droplet from the tip of a drop probe, said solution being adhered in a bottom portion of said drop probe above the wafer in a material of a surface tension sufficiently higher than the surface tension on said wafer, said drop probe being pivotably connected to a pivot arm which upon pivoting or turning one notch enables droplet sweeping of metal contaminants on a concentric circle on said wafer on said rotating plate;
   c) successively turning said pivot arm a sufficient number of notches to enable completion of wafer droplet sweepings through concentric circles to reach the edge of the wafer until all of the surface of said wafer is swept; and
   d) pipetting the solution droplet containing metal contaminants out of said probe for analysis.

2. The process of claim 1 wherein said drop probe material is polytetrafluoroethylene.

3. The process of claim 2 wherein in step a) said rotating plate is rotating at a speed of from about 8 to about 12 rpm.

4. The process of claim 3 wherein in step b) one notch is equal to about 1.5 degrees.

5. The process of claim 4 wherein said faster time is about 1.5 minutes.

6. The process of claim 5 wherein the tip of said drop probe is a sufficient height above said wafer surface such that, in combination with the differential of the surface tension between the material of said drop probe and the wafer, the drop will not fall from the wafer.

7. The process of claim 6 wherein in step b) the tip of said drop probe is about 3 to about 4 mm above said wafer surface.

8. The process of claim 7 wherein said wafer is an etched silicon wafer.

9. The process of claim 8 wherein said drop probe is hollow.

10. An apparatus for cleaning a semiconductor wafer to remove metallic contaminants without the use of robotics and without risk of scanning droplets falling from the wafer, in a faster time than with a manual processes using a vacuum wand, comprising:
    motor controller means to control the rotational rate of a rotateable plate with wafer stand-offs;
    platform means above said motor controller to pivotably accommodate a rotatable plate;
    rotateable plate means pivotably mounted above said platform to hold the wafer stand-offs; and
    shaft means mounted on said platform in attachment to a drop probe by a pivot arm, said drop probe extending downward and over said rotateable plate with wafer stand-offs at a sufficient distance above said wafer such that, when a solution droplet suspended from the probe inscribes a concentric circle on said wafer, due to the higher surface tension of the material holding the solution droplet at the bottom of the probe, the solution adheres to the bottom of the probe to slide over the wafer surface to clean off trace metals.

11. The apparatus of claim 10 wherein said pivot arm is manually pivotable by gradations of about one notch to measure off about 1.5 degrees.

12. The apparatus of claim 11 wherein said drop probe material is polytetrafluoroethylene.

13. The apparatus of claim 12 wherein said drop probe is hollow.

14. The apparatus of claim 13 wherein said motor controller means has an adjustable speed knob to control the rotational rate between about 8 to about 12 rpm.

* * * * *